(12) United States Patent
Hatakeyama et al.

(10) Patent No.: US 10,928,198 B2
(45) Date of Patent: Feb. 23, 2021

(54) DETECTION DEVICE FOR DETECTING DYNAMIC QUANTITY EXERTED ON MECHANICAL SYSTEM INCLUDING FIRST AND SECOND MECHANICAL OSCILLATORS

(71) Applicant: Kabushiki Kaisha Toshiba, Minato-ku (JP)

(72) Inventors: Yohei Hatakeyama, Yokohama (JP); Tetsuro Itakura, Nerima (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 246 days.

(21) Appl. No.: 15/690,710

(22) Filed: Aug. 30, 2017

(65) Prior Publication Data

US 2018/0143020 A1    May 24, 2018

(30) Foreign Application Priority Data

Nov. 21, 2016 (JP) .............................. JP2016-226295

(51) Int. Cl.
*G01C 19/56* (2012.01)
*G01C 19/5776* (2012.01)
(Continued)

(52) U.S. Cl.
CPC ......... *G01C 19/56* (2013.01); *G01C 19/5614* (2013.01); *G01C 19/5621* (2013.01); *G01C 19/5776* (2013.01); *B81B 2201/0242* (2013.01)

(58) Field of Classification Search
CPC ............ G01C 19/5776; G01C 19/5656; G01C 19/5649; G01C 19/567; G01C 19/5614; G01C 19/5726; G01C 19/30
See application file for complete search history.

(56) References Cited

U.S. PATENT DOCUMENTS 4,282,470 A * 8/1981 Reynolds ............... G01C 19/28
318/601
5,361,036 A * 11/1994 White ................ G01C 19/5607
73/489

(Continued)

FOREIGN PATENT DOCUMENTS

JP    4370331    11/2009
JP    4971490    7/2012

*Primary Examiner* — Tran M. Tran
(74) *Attorney, Agent, or Firm* — Oblon, McClelland, Maier & Neustadt, L.L.P.

(57) ABSTRACT

A detection device detects a dynamic quantity exerted on a detection mechanical system including first and second mechanical oscillators. The detection device includes first to third transducers, a canceller, a low-pass filter, and an inverting amplification unit. The first transducer detects the first mechanical oscillator position in a first direction to output a first signal. The second transducer detects the second mechanical oscillator position in a second direction to output a second signal. The canceller inverts a direction in which a signal detected by the second transducer from the second mechanical oscillator varies according to the first signal. The third transducer detects the second mechanical oscillator position in the second direction to output a third signal. The inverting amplification unit gives a control signal generated by inverting the third signal to a second actuator moving the second mechanical oscillator.

4 Claims, 13 Drawing Sheets

(51) Int. Cl.
  *G01C 19/5621*  (2012.01)
  *G01C 19/5614*  (2012.01)

(56) References Cited

U.S. PATENT DOCUMENTS

| | | | | |
|---|---|---|---|---|
| 5,505,084 A * | 4/1996 | Greiff | ............... | G01C 19/5719 |
| | | | | 73/504.14 |
| 5,604,309 A * | 2/1997 | Ward | ............... | G01C 19/5719 |
| | | | | 702/41 |
| 5,812,427 A * | 9/1998 | Nonoyama | ........... | G01P 15/124 |
| | | | | 324/166 |
| 5,893,054 A * | 4/1999 | White | ............... | G01C 19/5607 |
| | | | | 702/189 |
| 6,324,909 B1 * | 12/2001 | Wyse | ............... | G01C 19/5776 |
| | | | | 73/504.12 |
| 6,470,748 B1 * | 10/2002 | Geen | ............... | G01C 19/5719 |
| | | | | 73/504.12 |
| 6,765,305 B2 | 7/2004 | Mohaupt | ........... | G01C 19/5712 |
| | | | | 290/1 R |
| 6,964,195 B2 * | 11/2005 | Hobbs | ............... | G01C 19/5719 |
| | | | | 73/504.12 |
| 7,216,538 B2 * | 5/2007 | Ito | ............... | G01C 19/5719 |
| | | | | 73/504.12 |
| 7,340,954 B2 * | 3/2008 | Handrich | ........... | G01C 19/5747 |
| | | | | 73/504.04 |
| 7,481,110 B2 * | 1/2009 | Handrich | ........... | G01C 19/5747 |
| | | | | 73/504.12 |
| 7,978,785 B2 * | 7/2011 | Leifso | ............... | H03B 19/14 |
| | | | | 327/122 |
| 8,186,218 B2 * | 5/2012 | Nozawa | ............ | G01C 19/5607 |
| | | | | 73/504.12 |
| 8,618,890 B2 * | 12/2013 | Yanagisawa | ....... | G01C 19/5726 |
| | | | | 331/158 |
| 8,800,369 B2 | 8/2014 | Caminada et al. | | |
| 9,231,712 B2 * | 1/2016 | Hahn | ............... | H04B 1/525 |
| 9,484,890 B1 * | 11/2016 | Cazzaniga | .......... | G01C 19/5726 |
| 9,513,309 B2 * | 12/2016 | Sasaki | ............ | G01P 15/0802 |
| 9,568,490 B2 * | 2/2017 | Jeong | ............ | G01C 19/5726 |
| 9,689,677 B2 * | 6/2017 | Shao | ............... | G01C 19/5769 |
| 9,726,491 B2 * | 8/2017 | Stewart | ............ | G01C 19/5733 |
| 9,810,734 B2 * | 11/2017 | Maeda | ............ | G01C 19/5726 |
| 9,910,061 B2 * | 3/2018 | Waters | ............ | G01C 19/5705 |
| 10,191,079 B2 * | 1/2019 | Shirazi | ............ | G01C 19/5719 |
| 10,302,672 B2 * | 5/2019 | Kanemoto | ......... | G01C 19/574 |
| 10,534,015 B2 * | 1/2020 | Kuroda | ............ | G01C 19/5614 |
| 2007/0144255 A1 | 6/2007 | Handrich et al. | | |
| 2007/0234803 A1 * | 10/2007 | Gomez | ............ | G01C 19/5755 |
| | | | | 73/504.12 |
| 2018/0198661 A1 * | 7/2018 | Palmers | ............ | H04L 27/2627 |

* cited by examiner

US 10,928,198 B2

DETECTION DEVICE FOR DETECTING DYNAMIC QUANTITY EXERTED ON MECHANICAL SYSTEM INCLUDING FIRST AND SECOND MECHANICAL OSCILLATORS

CROSS-REFERENCE TO RELATED APPLICATIONS

This application is based upon and claims the benefit of priority from Japanese Patent Application No. 2016-226295, filed on Nov. 21, 2016; the entire contents of which are incorporated herein by reference.

FIELD

Embodiments described herein relate generally to a detection device and a sensor apparatus.

BACKGROUND

Vibratory gyroscopes manufactured with Micro Electro Mechanical Systems (MEMS) technology are known.

Such a vibratory gyroscope includes a first mechanical oscillator and a second mechanical oscillator. The first mechanical oscillator is a mechanical system held with a predetermined amount of spring force and capable of reciprocating in a first direction. The second mechanical oscillator is a mechanical system formed on a substrate on which the first mechanical oscillator is formed, held with a predetermined amount of spring force, and capable of reciprocating in a second direction perpendicular to the first direction.

The first mechanical oscillator of the vibratory gyroscope vibrates in the first direction. The Coriolis force acts in the second direction in the vibratory gyroscope when the substrate rotates around the axis perpendicular to both the first direction and the second direction while the first mechanical oscillator vibrates. The vibratory gyroscope detects the position of the second mechanical oscillator in the second direction while the first mechanical oscillator vibrates. This enables the vibratory gyroscope to detect an angular rate around the direction perpendicular to both the first direction and the second direction.

The output signal from the vibratory gyroscope includes two disturbances. One of the disturbances is quadrature error, and the other is a step response. The quadrature error is generated when the vibration of the first mechanical oscillator in the first direction is exerted on the second mechanical oscillator. The quadrature error is an error component having a phase difference of ±90° from a desired signal of the output signal. The error component of the quadrature error has amplitude that is not more than 10 times the output signal.

The step response is generated when the vibration of the first mechanical oscillator is turned on/off. The error component of the step response has amplitude that is not more than 100 times the desired signal of the output signal.

Amplifying an output signal including such two disturbances significantly decreases the signal-to-noise ratio (SNR) of the output signal. Thus, an AD converter with a wide dynamic range is required to detect the desired signal from such an output signal. This requirement increases circuit power.

DETAILED DESCRIPTION

According to an embodiment, a detection device detects a dynamic quantity exerted on a detection mechanical system. The detection mechanical system includes a first mechanical oscillator and a second mechanical oscillator. The first mechanical oscillator is a mechanical system held by a predetermined amount of spring force and capable of reciprocating in a first direction. The second mechanical oscillator is a mechanical system formed on a substrate on which the first mechanical oscillator is formed, held by a predetermined amount of spring force and capable of reciprocating in a second direction perpendicular to the first direction. The detection device includes a first transducer, a second transducer, a first multiplication unit, a low-pass filter, a third transducer, and an inverting amplification unit. The first transducer detects a position to which a first actuator makes the first mechanical oscillator reciprocate in the first direction and amplifies a detected signal, so as to output a first positional signal indicating the position of the first mechanical oscillator in the first direction. The second transducer detects a position of the second mechanical oscillator in the second direction and amplifies a detected signal, so as to output a second positional signal indicating the position of the second mechanical oscillator in the second direction. The first multiplication unit multiplies the signal that the second transducer detects from the second mechanical oscillator by the first positional signal before the signal is amplified. The low-pass filter removes a harmonic component from the second positional signal, so as to output an output signal indicating a detection result. The third transducer detects a position of the second mechanical oscillator in the second direction and amplifies a detected signal, so as to output a third positional signal indicating the position of the second mechanical oscillator in the second direction. The inverting amplification unit generates a control signal by inverting and amplifying the third positional signal, and gives the generated control signal to the second actuator that moves the second mechanical oscillator in the second direction.

First Embodiment

Figure 1:
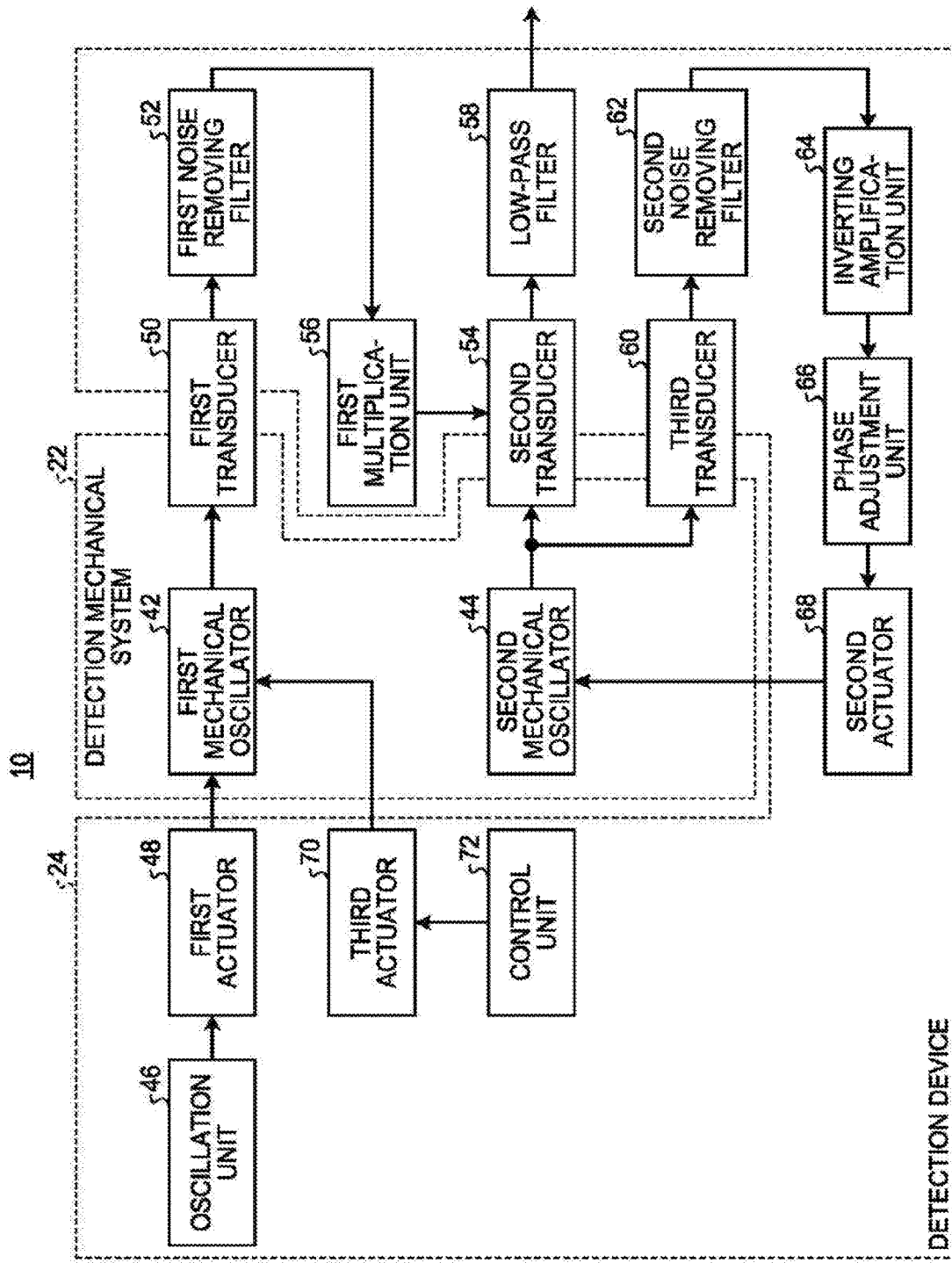
FIG. 1 is a view of a configuration of a sensor apparatus according to a first embodiment.

FIG. 1 is a view of a configuration of a sensor apparatus 10 according to a first embodiment. The sensor apparatus 10 accurately detects a dynamic quantity. For example, the sensor apparatus 10 is a vibratory gyroscope that accurately detects an angular rate.

The sensor apparatus 10 includes a detection mechanical system 22 and a detection device 24.

The detection mechanical system 22 is a mechanical structure for detecting a dynamic quantity. The detection mechanical system 22 is, for example, a semiconductor substrate formed with MEMS technology and capable of mechanically operating. Note that the detection mechanical system 22 is not necessarily a semiconductor substrate, and may also be a module including same mechanical components.

The detection device 24 is a device that detects a mechanical behavior of the detection mechanical system 22 and outputs an electrical signal. The detection device 24 is, for example, an electrical circuit that is formed on a semiconductor substrate and performs an electrical signal processing. The detection device 24 may be implemented with a semiconductor substrate, or with a plurality of semiconductor substrates. Alternatively, the detection device 24 may be implemented with a common semiconductor substrate shared with the detection mechanical system 22.

The detection mechanical system 22 includes a first mechanical oscillator 42 and a second mechanical oscillator 44. The first mechanical oscillator 42 and the second mechanical oscillator 44 are formed on the same substrate. The first mechanical oscillator 42 and the second mechanical oscillator 44 are formed, for example, on a semiconductor substrate with MEMS technology.

The first mechanical oscillator 42 is a mechanical system capable of reciprocating in a first direction. The first mechanical oscillator 42 is held in the first direction by a predetermined amount of spring force. The first mechanical oscillator 42 may include an attenuation mechanical system that attenuates the vibration in the first direction.

The second mechanical oscillator 44 is a mechanical system capable of reciprocating in a second direction perpendicular to the first direction. The second mechanical oscillator 44 is held in the second direction by a predetermined amount of spring force. The second mechanical oscillator 44 may include an attenuation mechanical system that attenuates the vibration in the second direction.

The first mechanical oscillator 42 and the second mechanical oscillator 44 each include a moving structure having a predetermined mass and capable of reciprocating, an elastic material (for example, a spring) that vibrates the moving structure, and an attenuation material (for example, a damper) that attenuates the vibration of the moving structure. The attenuation material may be, for example, air or a liquid.

The moving structure may be formed into a shape like a tuning fork with MEMS technology. In other words, the moving structure may be a plurality of vibration plates arranged in parallel at predetermined intervals. One sides of the vibration plates are fixed on the substrate. Such a moving structure includes open ends on the vibration plates that vibrate in the direction in which the vibration plates are arranged. The first mechanical oscillator 42 including such a moving structure has a structure in which the moving structure can move in the first direction. The second mechanical oscillator 44 including such a moving structure has a structure in which the moving structure can move in the second direction.

The Coriolis force acts in the second direction in the detection mechanical system 22 when the detection mechanical system 22 rotates around the direction perpendicular to both the first direction and the second direction while the first mechanical oscillator 42 vibrates in the first direction. The Coriolis force corresponds to an angular rate of the detection mechanical system 22. The Coriolis force that acts in the detection mechanical system 22 as described above vibrates the second mechanical oscillator 44 in the second direction.

Note that the frequency of the resonance of the second mechanical oscillator 44 is higher enough than the angular rate of the detection mechanical system 22. Thus, the Coriolis force that acts when the detection mechanical system 22 rotates does not vibrate the second mechanical oscillator 44 at the resonance point.

A detection device 24 includes an oscillation unit 46, a first actuator 48, a first transducer 50, a first noise removing filter 52, a second transducer 54, a first multiplication unit 56, a low-pass filter 58, a third transducer 60, a second noise removing filter 62, an inverting amplification unit 64, a phase adjustment unit 66, a second actuator 68, a third actuator 70, and a control unit 72.

The oscillation unit 46 outputs a periodic signal for vibrating the first mechanical oscillator 42 in the first direction. For example, the oscillation unit 46 outputs a periodic signal at the frequency of the resonance value of the first mechanical oscillator 42.

The first actuator 48 causes the first mechanical oscillator 42 to reciprocate in the first direction according to the periodic signal output from the oscillation unit 46. For example, when the frequency of the periodic signal is the resonance value of the first mechanical oscillator 42, the first actuator 48 can vibrate the first mechanical oscillator 42 at the resonance frequency. Note that a part or the whole of the first actuator 48 may be included in the detection mechanical system 22.

The first transducer 50 detects the position of the first mechanical oscillator 42 in the first direction. Then, the first transducer 50 amplifies a detected signal so as to output a first positional signal indicating the position of the first mechanical oscillator 42 in the first direction.

Note that the detection mechanical system 22 may include a part of the first transducer 50. For example, the first transducer 50 includes a position detecting device for detecting the position of the first mechanical oscillator 42 in the first direction. The position detecting device may be formed, for example, in the detection mechanical system 22 with MEMS technology.

For example, when the moving structure of the first mechanical oscillator 42 is a plurality of vibration plates, the position detecting device may include the vibration plates and, for example, a detection plate. Note that, in such a case, the vibration plates function as the first mechanical oscillator 42 and also function as the position detecting device. The detection plate is inserted into each gap between the vibration plates. The distance between the detection plate and vibration plate of the position detecting device varies when the vibration plate moves in the first direction.

Such a position detecting device changes the capacitance value between the detection plate and the vibration plate according to the position of the vibration plate in the first direction when the gap between the detection plate and the vibration plate includes, for example, air. Alternatively, the position detecting device changes the resistance value between the detection plate and the vibration plate according to the position of the vibration plate in the first direction when the gap between the detection plate and the vibration plate includes, for example, a conductive material. Alternatively, the position detecting device changes the voltage between the detection plate and the vibration plate according to the position of the vibration plate in the first direction when the gap between the detection plate and the vibration plate includes, for example, a material that generates a voltage according to the pressure.

The first transducer 50 detects, for example, the capacitance value, resistance value, or voltage value of the position detecting device described above, using an electrical circuit. Then, the first transducer 50 can output the first positional signal indicating the position of the first mechanical oscillator 42 in the first direction by amplifying the signal indicating the detected capacitance value, resistance value, or voltage value.

The first noise removing filter 52 removes a noise from the first positional signal output from the first transducer 50. For example, the first noise removing filter 52 may be a filter circuit, for example, using an operational amplifier. Alternatively, the detection device 24 may have a configuration without the first noise removing filter 52. Alternatively, the first noise removing filter 52 may be integrated with the amplification unit included in the first transducer 50.

Note that the detection device 24 may feed the first positional signal output from the first noise removing filter 52 back to the first actuator 48 as positive feedback. When the first positional signal is fed back to the first actuator 48 as positive feedback, the first actuator 48, the first mechanical oscillator 42, the first transducer 50, and the first noise removing filter 52 form an oscillator that oscillates at the resonance value of the first mechanical oscillator 42. Thus, in this case, the detection device 24 does not include the oscillation unit 46. Such a detection device 24 can vibrate the first mechanical oscillator 42 with low energy.

The second transducer 54 detects the position of the second mechanical oscillator 44 in the second direction. Then, the second transducer 54 amplifies a detected signal so as to output a second positional signal indicating the position of the second mechanical oscillator 44 in the second direction.

Note that the detection mechanical system 22 may include a part of the second transducer 54. For example, the second transducer 54 includes a position detecting device for detecting the position of the second mechanical oscillator 44 in the second direction. The position detecting device may be formed, for example, in the detection mechanical system 22 with MEMS technology. Similarly to the position detecting device included in the first transducer 50, the position detecting device may have a configuration that changes the capacitance value, the resistance value, or the voltage value.

The first multiplication unit 56 obtains the first positional signal output from the first noise removing filter 52. Then, the first multiplication unit 56 multiplies the signal that the second transducer 54 detects from the second mechanical oscillator 44 by the first positional signal before the signal is amplified.

For example, when the second transducer 54 includes the position detecting device that changes the capacitance value and the resistance value, the first multiplication unit 56 varies the bias voltage or bias current to be provided to the position detecting device included in the second transducer 54 according to the first positional signal. This enables the first multiplication unit 56 to multiply the signal that the position detecting device detects by the first positional signal before the signal is amplified.

In addition, the first multiplication unit 56 inverts the direction in which the signal that the second transducer 54 detects from the second mechanical oscillator 44 varies, according to the binary first positional signal. For example, when the second transducer 54 outputs a differential signal, the first multiplication unit 56 interchanges a signal line connected to a positive input terminal of the amplification unit and a signal line connected to a negative input terminal of the amplification unit according to the binary first positional signal. This enables the first multiplication unit 56 to multiply the signal that the second transducer 54 detected from the second mechanical oscillator 44 by the first positional signal.

The first positional signal is a signal indicating the vibration of the first mechanical oscillator 42. In other words, the first positional signal is a signal indicating quadrature error to the output signal. In addition, the first multiplication unit 56 can remove a first positional signal from the signal output from the second transducer 54 by multiplying the signal detected from the second mechanical oscillator 44 by the first positional signal. Thus, the first multiplication unit 56 enables the second transducer 54 to output the second positional signal indicating the desired signal from which the quadrature error is removed.

In addition, the first multiplication unit 56 performs the multiplication of the first positional signal before the signal amplification circuit of the second transducer 54. This enables the first multiplication unit 56 to remove the disturbance from the signal before the signal is amplified. This enables the second transducer 54 to amplify the desired signal from which the disturbance is removed. This improves the signal-to-noise ratio (SNR) of the signal.

The low-pass filter 58 removes a harmonic component from the second positional signal output from the second transducer 54. In other words, the low-pass filter 58 removes the harmonic component generated at the multiplication by the first positional signal. Then, the second positional signal from which the harmonic component is removed is output as an output signal indicating the detection result. Note that the low-pass filter 58 may be integrated with the amplification unit included in the second transducer 54.

The third transducer 60 detects the position of the second mechanical oscillator 44 in the second direction. Then, the third transducer 60 amplifies a detected signal so as to output a third positional signal indicating the position of the second mechanical oscillator 44 in the second direction.

Note that the third transducer 60 is provided separately from the second transducer 54. In addition, the detection mechanical system 22 may include a part of the third transducer 60. For example, the third transducer 60 includes a position detecting device for detecting the position of the second mechanical oscillator 44 in the second direction. The position detecting device may be formed, for example, in the detection mechanical system 22 with MEMS technology. Similarly to the position detecting device of the first transducer 50, the position detecting device may have a configuration that changes the capacitance value, the resistance value, or the voltage value.

The second noise removing filter 62 removes a noise from the third positional signal output from the third transducer 60. For example, the second noise removing filter 62 may be a filter circuit, for example, using an operational amplifier. Alternatively, the detection device 24 may have a configuration without the second noise removing filter 62. Alternatively, the second noise removing filter 62 may be integrated with the amplification unit included in the third transducer 60.

The inverting amplification unit 64 obtains the third positional signal output from the second noise removing filter 62. Then, the inverting amplification unit 64 generates a control signal by inverting and amplifying the third positional signal.

The phase adjustment unit 66 obtains the control signal from the inverting amplification unit 64. The phase adjustment unit 66 adjusts the phase of the control signal by the amount of phase corresponding to the response lag in the second mechanical oscillator 44. The amount of phase to be adjusted will be described below with reference to FIG. 3. In addition, the detection device 24 may sometimes be without the phase adjustment unit 66. Such a case will also be described below with reference to FIG. 3.

The second actuator 68 moves the second mechanical oscillator 44 in the second direction according to the control signal output from the phase adjustment unit 66.

For example, when the first mechanical oscillator 42 repeatedly turns a vibration period on and off (repeatedly turns an angular rate measurement period on and off), the disturbance in the step response is applied to the second mechanical oscillator 44. However, the third transducer 60, the second noise removing filter 62, the inverting amplification unit 64, the phase adjustment unit 66, and the second actuator 68 detect the position to which the second mechanical oscillator 44 is moved, and controls the position to which the second mechanical oscillator 44 is moved using negative feedback. This control enables the second mechanical oscillator 44 to stably operate even if the disturbance in the step response is applied. Accordingly, the detection device 24 can output an output signal from which the disturbance in the step response is removed. Note that a part or the whole of the second actuator 68 may be included in the detection mechanical system 22.

The third actuator 70 stops the movement of the first mechanical oscillator 42 in the first direction. For example, the third actuator 70 gives force sufficiently stronger than the first actuator 48 to the first mechanical oscillator 42 to forcibly stop the movement of the first mechanical oscillator 42 even while the force by the first actuator 48 is applied. Note that a part or the whole of the third actuator 70 may be included in the detection mechanical system 22.

The control unit 72 controls the third actuator 70 to make the first mechanical oscillator 42 reciprocate during the measurement period, and stop the reciprocation of the first mechanical oscillator 42 during a period that is not a measurement period.

Figure 2:
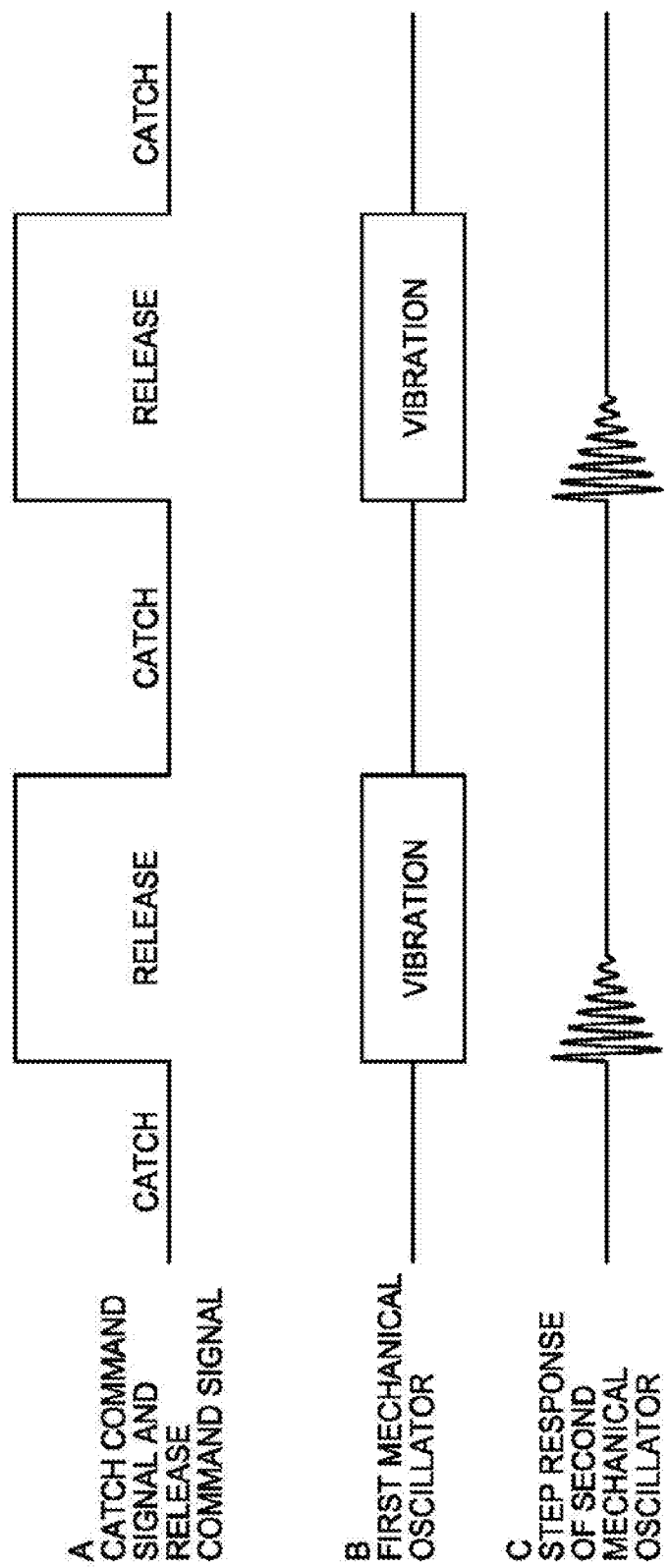
FIG. 2 is a waveform chart, for example, of a disturbance exerted on a second mechanical oscillator.

FIG. 2 is a waveform chart of a CR signal, the vibration of the first mechanical oscillator 42, and a disturbance exerted on the second mechanical oscillator 44.

The control unit 72 gives the third actuator 70 a catch command (a stop command) to stop the reciprocation of the first mechanical oscillator 42 during a period that is not a measurement period in which the angular rate of the detection mechanical system 22 is measured. Then, the control unit 72 gives the third actuator 70 a release command (movement allowance command) to start the reciprocation of the first mechanical oscillator 42 during the measurement period in which the angular rate of the detection mechanical system 22 is measured. For example, as illustrated in A of FIG. 2, the control unit 72 gives the third actuator 70 a control signal repeating the catch command and the release command.

As illustrated in B of FIG. 2, the first mechanical oscillator 42 does not vibrate during the period in which the control unit 72 outputs the catch command. The first mechanical oscillator 42 vibrates during the period in which the control unit 72 outputs the release command. In other words, the first mechanical oscillator 42 vibrates intermittently.

The second mechanical oscillator 44 receives the disturbance in the step response caused by the intermittent operation of the first mechanical oscillator 42. Thus, the second mechanical oscillator 44 vibrates in response to the disturbance in the step response at the resonance frequency of the second mechanical oscillator 44 as illustrated in C of FIG. 2 unless any measure is taken to remove the step response.

Figure 3:
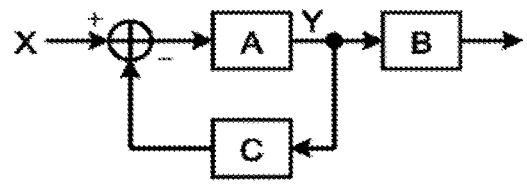
FIG. 3 is a block diagram of a transfer characteristic of the sensor apparatus according to the first embodiment.

FIG. 3 is a block diagram of a transfer characteristic of the sensor apparatus 10 according to the first embodiment in order to remove the step response.

FIG. 3 illustrates an exemplary transfer characteristic of a feedback system including the second mechanical oscillator 44, the third transducer 60, the second noise removing filter 62, the inverting amplification unit 64, the phase adjustment unit 66, and the second actuator 68. The X indicates the disturbance exerted on the second mechanical oscillator 44. The Y indicates the position of the second mechanical oscillator 44 in the second direction. The A indicates a resonance transfer function of a mechanical system of the second mechanical oscillator 44. The B indicates a transfer function of the second transducer 54, and the B is a constant. The C indicates a transfer function of a feedback system from the third transducer 60 to the second actuator 68, and the C is a constant.

To simplify the transfer characteristic, the resonance transfer function of the second mechanical oscillator 44 takes Q as a gain (Q value) at the resonance frequency and takes one as the gain at a frequency lower than the resonance frequency. In such a case, the transfer function in FIG. 3 is Y/X=A/(1+AC).

It is assumed that the C is $\frac{1}{100}$. In this case, the AC is smaller enough than one. Thus, the transfer function is Y/X=(A/(1+AC))≈A at a frequency lower than the resonance frequency. In contrast, A=Q holds and the A is larger enough than one at the resonance frequency. Thus, the transfer function is Y/X=(A/(1+AC))≈1/C.

As described above, the transfer function shows that the gain decreases at the resonance frequency. In contrast, the transfer function shows that the gain does not decrease at frequencies except for the resonance frequency.

Accordingly, the detection device 24 can decrease an attenuation time constant by reducing the effective Q value of the second mechanical oscillator 44 by 1/CQ. The frequency of the Coriolis force that acts in the detection mechanical system 22 is set at a frequency lower enough than the resonance frequency of the second mechanical oscillator 44. Thus, the detection device 24 can transfer the desired signal except for a signal at the resonance frequency without attenuating the desired signal.

Furthermore, the phase adjustment unit 66 adjusts the phase of the control signal by the amount of phase corresponding to the response lag in the second mechanical oscillator 44.

The resonance transfer function of the mechanical system of the second mechanical oscillator 44 (the A illustrated in FIG. 3) is a second order lag system. Thus, the phase lag of the resonance transfer function is 180° at most. In general, the feedback circuit oscillates when feeding the signal lagging 180° back as negative feedback. The phase adjustment unit 66 adjusts the phase of the control signal to prevent the oscillation. For example, the phase adjustment unit 66 differentiates the control signal to adjust the range of the phase between −90° and +90°. This adjustment enables the phase adjustment unit 66 to prevent the oscillation caused by the feedback of the disturbance in the step response.

The phase adjustment unit 66 may be implemented, for example, with an operational amplifier and a capacitor. The phase adjustment unit 66 is not limited to such a configuration and may have another configuration.

Note that the third transducer 60 may include a position detecting device that detects a current from a variable capacitance controlled at a constant voltage. The detection device 24 does not necessarily include the phase adjustment unit 66 when including such a third transducer 60.

When a constant voltage is applied to the variable capacitance, the variable capacitance is electrically charged with charge of Q=C×V. The slight change of the variable capacitance makes ΔQ=ΔC×V hold. The current is calculated from the differential value of the charge amount. In other words, the current is calculated with I=ΔQ/Δt=ΔC/Δt×V. Thus, when the third transducer 60 detects the current from the position detecting device (variable capacitance) controlled at a constant voltage, the third transducer 60 of the detection device 24 has a differentiating function. Thus, the detection device 24 without the phase adjustment unit 66 can also adjust the range of the phase of the control signal between −90° and +90°.

As described above, the detection device 24 according to the present embodiment can remove the quadrature error from the second positional signal. With this removal, the detection device 24 can also remove the disturbance in step response from the second positional signal.

Thus, the detection device 24 can accurately detect the dynamic quantity exerted on the detection mechanical system 22 with a low power. For example, the detection device 24 can accurately detects the angular rate exerted on the detection mechanical system 22 at a low power.

Figure 4:
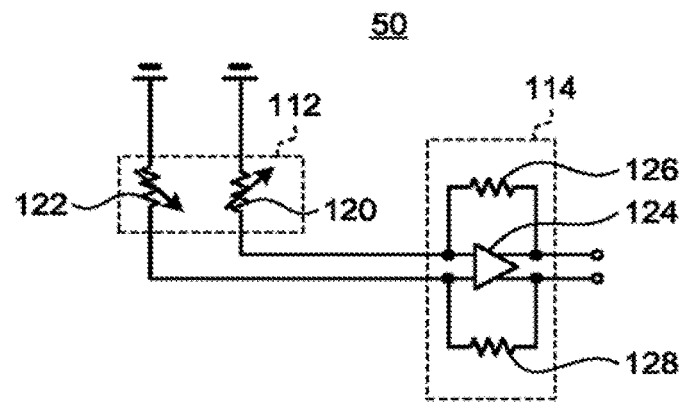
FIG. 4 is a view of a first example of a first transducer.

FIG. 4 illustrates a first example of the first transducer 50. The first transducer 50 according to the first example includes a first position detecting device 112 and a first amplification unit 114.

The first position detecting device 112 includes a first variable resistance 120, and a second variable resistance 122. The first amplification unit 114 includes a first differential amplifier 124, a first resistance 126, and a second resistance 128.

The first variable resistance 120 is connected between power source potential (VDD) and a positive input terminal of the first differential amplifier 124. The second variable resistance 122 is connected between power source potential (VDD) and a negative input terminal of the first differential amplifier 124.

The first resistance 126 is connected between the positive input terminal of the first differential amplifier 124 and a positive output terminal of the first differential amplifier 124. The second resistance 128 is connected between the negative input terminal of the first differential amplifier 124 and a negative output terminal of the first differential amplifier 124.

The first differential amplifier 124 outputs a differential signal having a voltage difference corresponding to the difference between the current flowing in the first variable resistance 120 and the current flowing in the second variable resistance 122.

The resistance value of each of the first variable resistance 120 and the second variable resistance 122 varies depending on the position of the first mechanical oscillator 42 in the first direction. There is a potential difference of a common potential (CM) between the positive input terminal and negative input terminal of the first differential amplifier 124. The common potential (CM) is, for example, a middle-point voltage (VDD/2) between a ground potential (GND) and the power source potential (VDD). Thus, the potential difference between the first variable resistance 120 and the second variable resistance 122 is constantly VDD/2. Thus, a change of the resistance value changes the flowing current.

The direction in which the resistance value of the first variable resistance 120 changes is opposite to the direction in which the resistance value of the second variable resistance 122 changes. Accordingly, the first differential amplifier 124 can output the differential signal having the voltage difference corresponding to the position of the first mechanical oscillator 42 in the first direction. Note that the first transducer 50 according to the first example is referred to as a resistive transducer.

Figure 5:
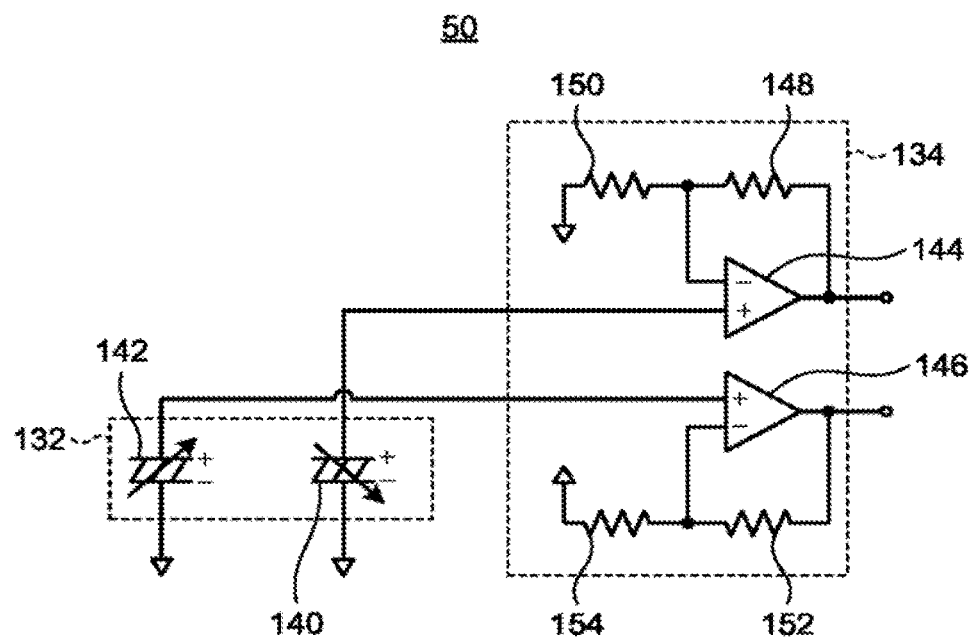
FIG. 5 is a view of a second example of the first transducer.

FIG. 5 illustrates a second example of the first transducer 50. The first transducer 50 according to the second example includes a second position detecting device 132 and a second amplification unit 134.

The second position detecting device 132 includes a first piezoelectric element 140, and a second piezoelectric element 142. The second amplification unit 134 includes a first operational amplifier 144, a second operational amplifier 146, a third resistance 148, a fourth resistance 150, a fifth resistance 152, and a sixth resistance 154.

The first piezoelectric element 140 is connected between common potential (CM) and a non-inverting input terminal of the first operational amplifier 144. The second piezoelectric element 142 is connected between common potential (CM) and a non-inverting input terminal of the second operational amplifier 146.

The third resistance 148 is connected between an output terminal of the first operational amplifier 144 and an inverting input terminal of the first operational amplifier 144. The fourth resistance 150 is connected between the inverting input terminal of the first operational amplifier 144 and the common potential (CM). The fifth resistance 152 is connected between an output terminal of the second operational amplifier 146 and an inverting input terminal of the second operational amplifier 146. The sixth resistance 154 is connected between the inverting input terminal of the second operational amplifier 146 and the common potential (CM). A node connected to the first operational amplifier 144 of the first piezoelectric element 140 is connected to the common potential (CM) via as high-resistance element, for example. A node connected to the second operational amplifier 146 of the second piezoelectric element 142 is connected to the common potential (CM) via a high-resistance element, for example.

The first operational amplifier 144 and the second operational amplifier 146 output a differential signal having a voltage corresponding the difference between the voltage applied to the non-inverting input terminal of the first operational amplifier 144 and the voltage applied to the non-inverting input terminal of the second operational amplifier 146.

The voltage value generated by each of the first piezoelectric element 140 and the second piezoelectric element 142 changes depending on the position of the first mechanical oscillator 42 in the first direction. The direction in which the voltage value generated by the first piezoelectric element 140 changes is opposite to the direction in which the voltage value generated by the second piezoelectric element 142 changes. Thus, a voltage difference corresponding to the position of the first mechanical oscillator 42 in the first direction is generated between the output terminal of the first operational amplifier 144 and the output terminal of the second operational amplifier 146. Thus, the first operational amplifier 144 and the second operational amplifier 146 can output a differential signal having a voltage corresponding to the position of the first mechanical oscillator 42 in the first direction. Note that the first transducer 50 according to the second example is referred to as a piezoelectric transducer.

Figure 6:
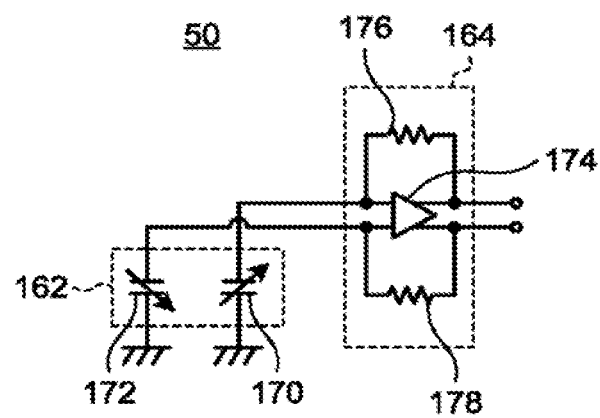
FIG. 6 is a view of a third example of the first transducer.

FIG. 6 illustrates a third example of the first transducer 50. The first transducer 50 according to the third example includes a third position detecting device 162 and a third amplification unit 164.

The third position detecting device 162 includes a first variable capacitance 170, and a second variable capacitance 172. The third amplification unit 164 includes a second differential amplifier 174, a seventh resistance 176, and an eighth resistance 178.

The first variable capacitance 170 is connected between ground potential (GND) and a positive input terminal of the second differential amplifier 174. The second variable capacitance 172 is connected between ground potential (GND) and a negative input terminal of the second differential amplifier 174.

The seventh resistance 176 is connected between the positive input terminal of the second differential amplifier 174 and a positive output terminal of the second differential amplifier 174. The eighth resistance 178 is connected between the negative input terminal of the second differential amplifier 174 and a negative output terminal of the second differential amplifier 174.

The second differential amplifier 174 outputs a differential signal having a voltage corresponding to the difference between the current flowing the first variable capacitance 170 and the current flowing the second variable capacitance 172.

The capacitance value of each of the first variable capacitance 170 and the second variable capacitance 172 changes depending on the position of the first mechanical oscillator 42 in the first direction. There is a potential difference of a common potential (CM) between the positive input terminal and negative input terminal of the second differential amplifier 174. Thus, there is a constant potential difference between the first variable capacitance 170 and the second variable capacitance 172. Thus, a change of the capacitance value changes the flowing current.

The direction in which the capacitance value of the first variable capacitance 170 changes is opposite to the direction in which the capacitance value of the second variable capacitance 172 changes. Thus, the second differential amplifier 174 can output a differential signal having a voltage corresponding to the position of the first mechanical oscillator 42 in the first direction. Note that the first transducer 50 according to the third example is referred to as a capacitive transducer.

Figure 7:
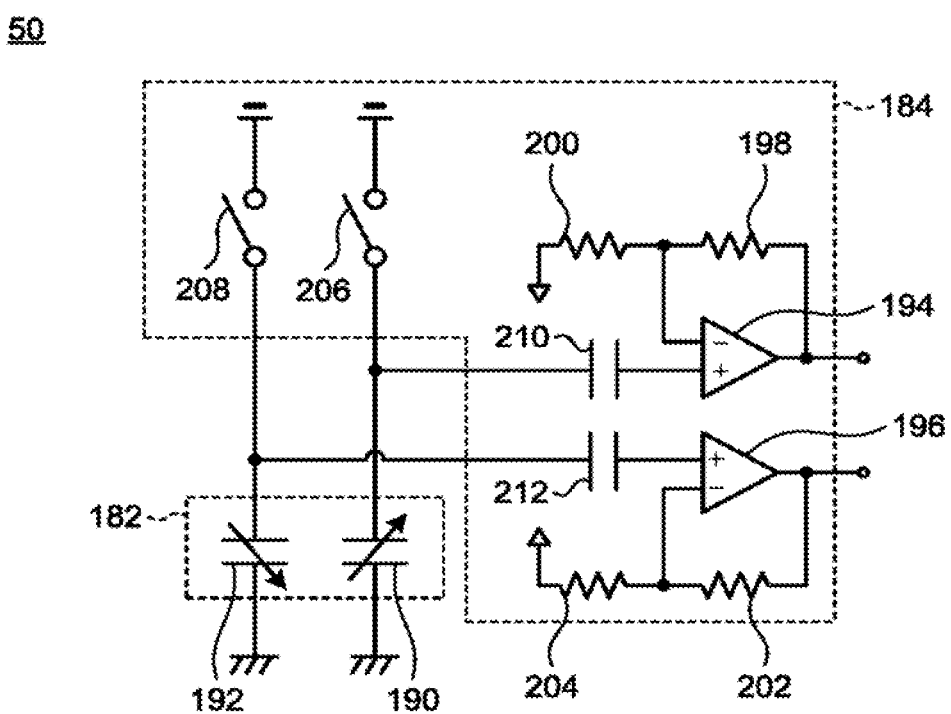
FIG. 7 is a view of a fourth example of the first transducer.

FIG. 7 illustrates a fourth example of the first transducer 50. The first transducer 50 according to the fourth example includes a fourth position detecting device 182, and a fourth amplification unit 184.

The fourth position detecting device 182 includes a third variable capacitance 190, and a fourth variable capacitance 192. The fourth amplification unit 184 includes a third operational amplifier 194, a fourth operational amplifier 196, a ninth resistance 198, a tenth resistance 200, an eleventh resistance 202, a twelfth resistance 204, a first switch 206, a second switch 208, a first fixed capacitance 210, and a second fixed capacitance 212.

The third variable capacitance 190 includes an end connected to ground potential (GND). The fourth variable capacitance 192 includes an end connected to ground potential (GND). A node connected to the third operational amplifier 194 of the first fixed capacitance 210 and a node connected to the fourth operational amplifier 196 of the second fixed capacitance 212 are each connected to common potential (CM), via a high-resistance element, for example.

The ninth resistance 198 is connected between an output terminal of the third operational amplifier 194 and an inverting input terminal of the third operational amplifier 194. The tenth resistance 200 is connected between the inverting input terminal of the third operational amplifier 194 and common potential (CM). The eleventh resistance 202 is connected between an output terminal of the fourth operational amplifier 196 and an inverting input terminal of the fourth operational amplifier 196. The twelfth resistance 204 is connected between the inverting input terminal of the fourth operational amplifier 196 and common potential (CM).

The first switch 206 is connected between an end of the third variable capacitance 190 that is not connected to ground potential (GND) and power source potential (VDD). The second switch 208 is connected between an end of the fourth variable capacitance 192 that is not connected to ground potential (GND) and power source potential (VDD).

The first fixed capacitance 210 is connected between the end of the third variable capacitance 190 that is not connected to ground potential (GND) and a non-inverting input terminal of the third operational amplifier 194. The second fixed capacitance 212 is connected between the end of the fourth variable capacitance 192 that is not connected to ground potential (GND) and a non-inverting input terminal of the fourth operational amplifier 196.

The first switch 206 and the second switch 208 are periodically turned on and electrically charge the third variable capacitance 190 and the fourth variable capacitance 192 with a constant amount of charge. The first switch 206 and the second switch 208 are turned off during the measurement period. Thus, a constant amount of charge is accumulated in each of the third variable capacitance 190 and the fourth variable capacitance 192 during the measurement period.

The third operational amplifier 194 and the fourth operational amplifier 196 output as differential signal having a voltage corresponding to the difference between the voltage applied to the non-inverting input terminal of the third operational amplifier 194 and the voltage applied to the non-inverting input terminal of the fourth operational amplifier 196.

The capacitance value of each of the third variable capacitance 190 and the fourth variable capacitance 192 changes depending on the position of the first mechanical oscillator 42 in the first direction. A change of the capacitance value of each of the third variable capacitance 190 and the fourth variable capacitance 192 changes the generated voltage because the amount of charge is constant.

The direction in which the capacitance value of the third variable capacitance 130 changes is opposite to the direction in which the capacitance value of the fourth variable capacitance 192 changes. Thus, a voltage difference corresponding to the position of the first mechanical oscillator 42 in the first direction is generated between the output terminal of the third operational amplifier 194 and the output terminal of the fourth operational amplifier 196. Thus, the first operational amplifier 144 and the second operational amplifier 146 can output a differential signal having a voltage difference corresponding to the position of the first mechanical oscillator 42 in the first direction. Note that the first transducer 50 according to the fourth example is referred to as a charge-fixed transducer.

Figure 8:
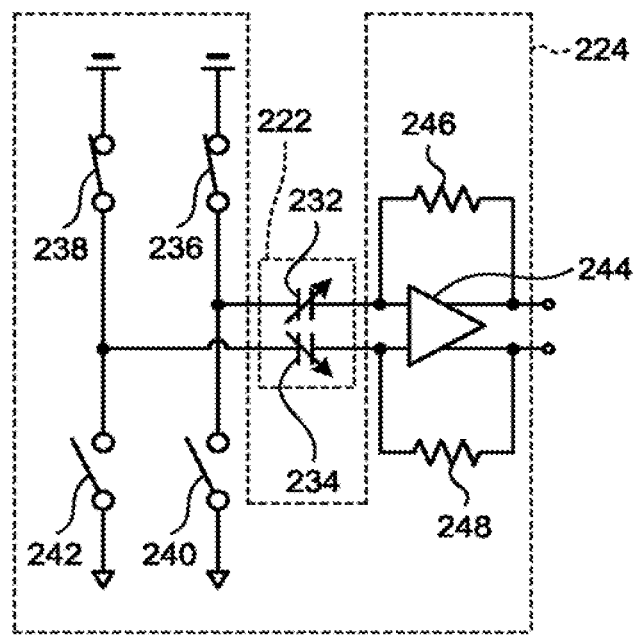
FIG. 8 is a view of a fifth example of the first transducer.

FIG. 8 illustrates a fifth example of the first transducer 50. The first transducer 50 according to the fifth example includes a fifth position detecting device 222, and a fifth amplification unit 224.

The fifth position detecting device 222 includes a fifth variable capacitance 232, and a sixth variable capacitance 234. The fifth amplification unit 224 includes a third switch 236, a fourth switch 238, a fifth switch 240, a sixth switch 242, a third differential amplifier 244, a thirteenth resistance 246, and a fourteenth resistance 248.

The third switch 236 and the fifth switch 240 are connected in series between common potential (CM) and power source potential (VDD). The fourth switch 238 and the sixth switch 242 are connected in series between common potential (CM) and power source potential (VDD).

The fifth variable capacitance 232 is connected between a connection point of the third switch 236 with the fifth switch 240 and a positive input terminal of the third differential amplifier 244. The sixth variable capacitance 234 is connected between a connection point of the fourth switch 238 with the sixth switch 242 and a negative input terminal of the third differential amplifier 244.

The thirteenth resistance 246 is connected between the positive input terminal of the third differential amplifier 244 and a positive output terminal of the third differential amplifier 244. The fourteenth resistance 248 is connected between the negative input terminal of the third differential amplifier 244 and a negative output terminal of the third differential amplifier 244.

The third differential amplifier 244 outputs a differential signal having a voltage corresponding to the difference between the current flowing in the fifth variable capacitance 232 and the current flowing in the sixth variable capacitance 234.

For example, the control unit 72 repeats the measurement period and a discharge period, alternately. In the measurement period, the third switch 236 and the fourth switch 238 are turned on and the fifth switch 240 and the sixth switch 242 are turned off. In the discharge period, the third switch 236 and the fourth switch 238 are turned off and the fifth switch 240 and the sixth switch 242 are turned on. For example, the control unit 72 repeats the measurement period and the discharge period in a cycle enough shorter than a vibration cycle in which the first mechanical oscillator 42 vibrates.

The capacitance value of each of the fifth variable capacitance 232 and the sixth variable capacitance 234 changes depending on the position of the first mechanical oscillator 42 in the first direction. There is a potential difference of a common potential (CM) between the positive input terminal and negative input terminal of the third differential amplifier 244. Thus, there is a constant potential difference between the fifth variable capacitance 232 and the sixth variable capacitance 234 during the measurement period. Thus, a change of the capacitance value changes the flowing current.

The direction in which the capacitance value of the fifth variable capacitance 232 changes is opposite to the direction in which the capacitance value of the sixth variable capacitance 234 changes. Thus, the third differential amplifier 244 can output a differential signal having a voltage corresponding to the position of the first mechanical oscillator 42 in the first direction during the measurement period. Note that the first transducer 50 according to the fifth example is referred to as a switched-capacitor transducer.

The examples of the circuit of the first transducer 50 have been described above with reference to FIG. 4 to FIG. 8. The third transducer 60 may have the same configuration as that of the first transducer 50. Note that if the third transducer 60 is a capacitance and a switched-capacitor transducer, the third transducer 60 has a differentiating function. In such a case, the detection device 24 may have a configuration without the phase adjustment unit 66.

Each of the amplification units (the first amplification unit 114, the second amplification unit 134, the third amplification unit 164, the fourth amplification unit 184, and the fifth amplification unit 224) of the first transducer 50 described with reference to FIG. 4 to FIG. 8 may have a configuration including impedance instead of the resistance. The first transducer 50 described with reference to FIG. 4 to FIG. 8 may have a configuration in which each of the amplification units (the first amplification unit 114, the second amplification unit 134, the third amplification unit 164, the fourth amplification unit 184, and the fifth amplification unit 224) is integrated with the following first noise removing filter 52. In such a case, for example, each of the amplification units has a configuration that removes a signal in a specific frequency band using impedance instead of the resistance.

Figure 9:
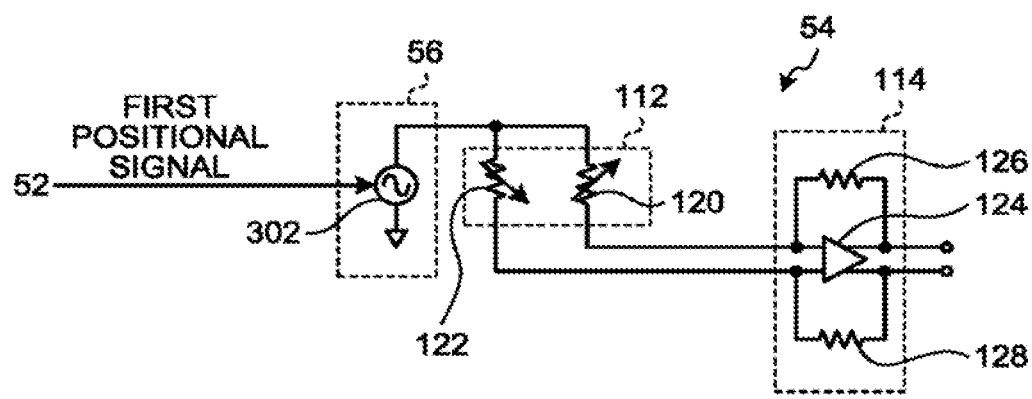
FIG. 9 is a view of a first example of a bias-type first multiplication unit and a second transducer.

FIG. 9 illustrates a first example of a bias-type first multiplication unit 56 and a second transducer 54. The second transducer 54 according to the first example has approximately the same configuration as the resistance first transducer 50 illustrated in FIG. 4. Thus, the same components will be put with the same reference signs and the descriptions will be omitted.

The first multiplication unit 56 according to the first example includes a voltage generation unit 302. The voltage generation unit 302 generates a voltage corresponding to the first positional signal output from the first noise removing filter 52 around common potential (CM).

The first position detecting device 112 of the second transducer 54 according to the first example operates by the voltage generated by the voltage generation unit 302 instead of power source potential (VDD). In other words, the first variable resistance 120 is connected between a voltage output end of the voltage generation unit 302 and a positive input terminal of the first differential amplifier 124. The second variable resistance 122 is connected between the voltage output end of the voltage generation unit 302 and a negative input terminal of the first differential amplifier 124.

The first multiplication unit 56 according to the first example can vary the bias voltage to be applied to the first position detecting device 112 included in the second transducer 54 according to the first positional signal. As a result, the first multiplication unit 56 according to the first example can multiply the signal that the second transducer 54 detects from the second mechanical oscillator 44 by the first positional signal before the first amplification unit 114.

Figure 10:
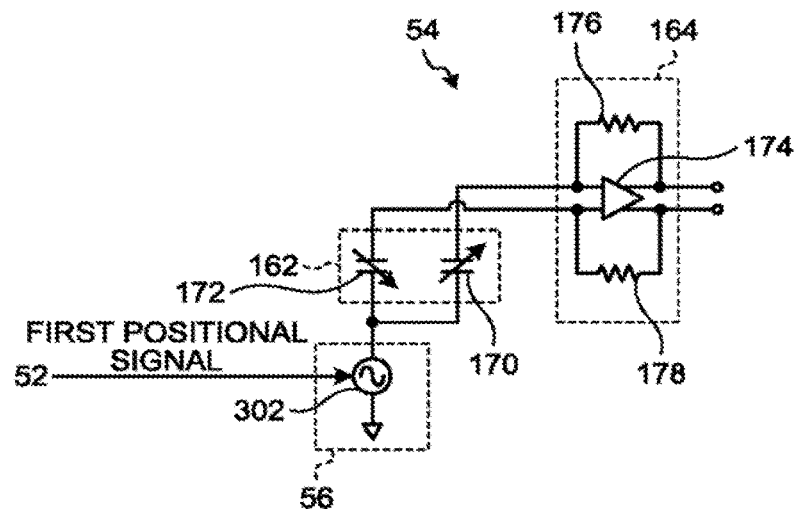
FIG. 10 is a view of a second example of a bias-type first multiplication unit and a second transducer.

FIG. 10 illustrates a second example of a bias-type first multiplication unit 56 and a second transducer 54. The second transducer 54 according to the second example has approximately the same configuration as the capacitance first transducer 50 illustrated in FIG. 6. Thus, the same components will be put with the same reference signs and the descriptions will be omitted.

The first multiplication unit 56 according to the second example includes a voltage generation unit 302. The voltage generation unit 302 has the same configuration as the configuration illustrated in FIG. 9.

A third position detecting device 162 of the second transducer 54 according to the second example operates based on the voltage generated by the voltage generation unit 302. In other words, the first variable capacitance 170 is connected between a voltage output end of the voltage generation unit 302 and a positive input terminal of the second differential amplifier 174. The second variable capacitance 172 is connected between the voltage output end of the voltage generation unit 302 and a negative input terminal of the second differential amplifier 174.

Such a first multiplication unit 56 according to the second example can vary the bias voltage to be applied to the third position detecting device 162 included in the second transducer 54 according to the first positional signal. As a result, the first multiplication unit 56 according to the second example can multiply the signal that the second transducer 54 detects from the second mechanical oscillator 44 by the first positional signal before the third amplification unit 164.

Figure 11:
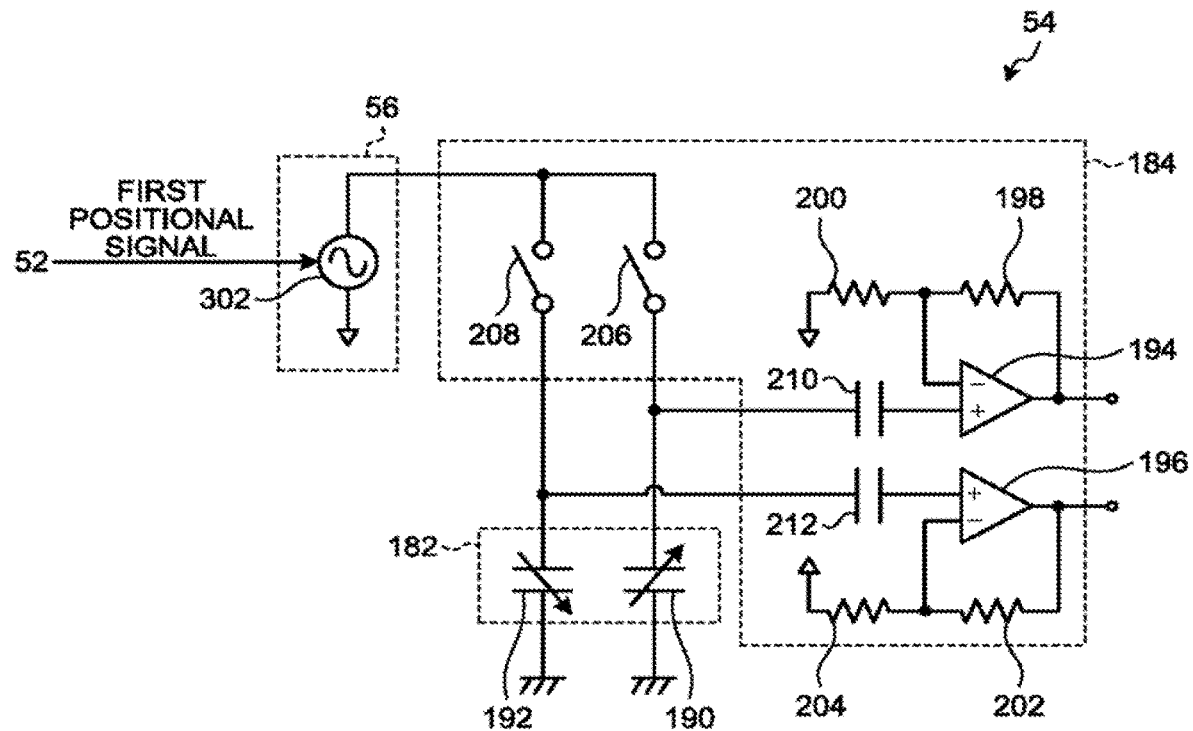
FIG. 11 is a view of a third example of a bias-type first multiplication unit and a second transducer.

FIG. 11 illustrates a third example of a bias-type first multiplication unit 56 and a second transducer 54. The second transducer 54 according to the third example has approximately the same configuration as the charge-fixed first transducer 50 illustrated in FIG. 7. Thus, the same components will be put with the same reference signs and the descriptions will be omitted.

The first multiplication unit 56 according to the third example includes a voltage generation unit 302. The voltage generation unit 302 has the same configuration as the configuration illustrated in FIG. 9.

Charge is accumulated in the fourth position detecting device 182 of the second transducer 54 according to the third example by the voltage generated by the voltage generation unit 302 via a switch instead of power source potential (VDD). In other words, the first switch 206 is connected between an end of the third variable capacitance 190 that is not connected to ground potential (GND) and at voltage output end of the voltage generation unit 302. The second switch 208 is connected between an end of the fourth variable capacitance 192 that is not connected to ground potential (GND) and the voltage output end of the voltage generation unit 302.

Such a first multiplication unit 56 according to the third example can vary the bias voltage to be applied to the fourth position detecting device 182 included in the second transducer 54 according to the first positional signal. As a result, the charge varying according to the first positional signal is accumulated in the third variable capacitance 190 and the fourth variable capacitance 192. Thus, the first multiplication unit 56 according to the third example can multiply the signal that the second transducer 54 detects from the second mechanical oscillator 44 by the first positional signal before the fourth amplification unit 184.

Figure 12:
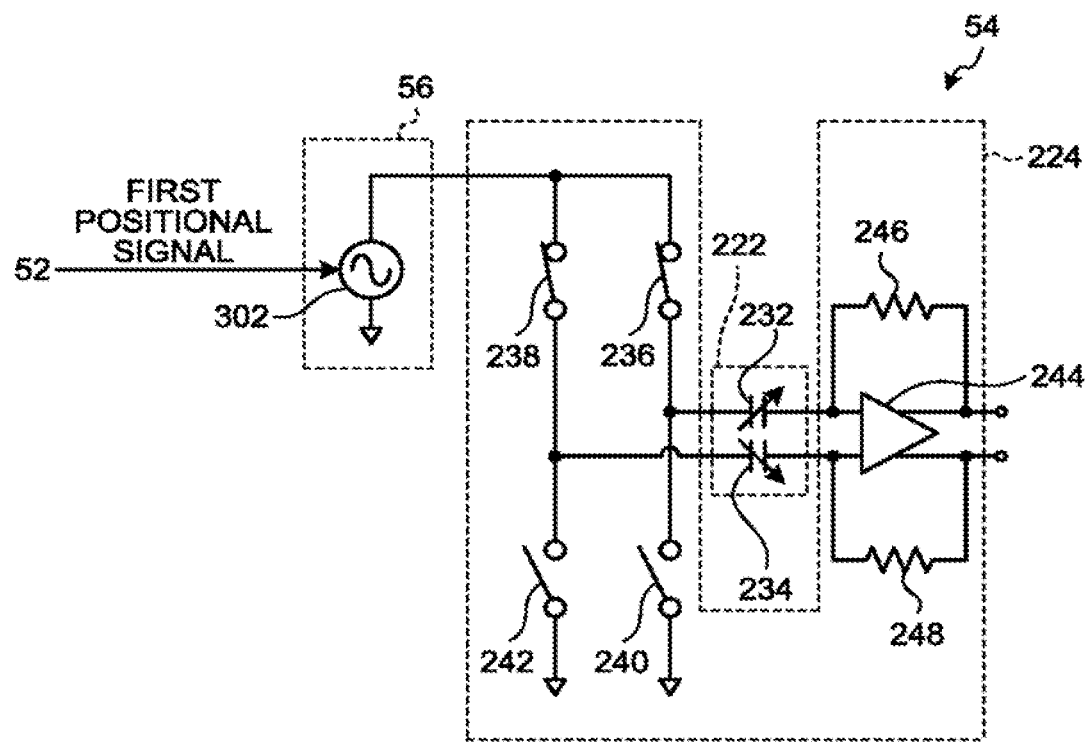
FIG. 12 is a view of a fourth example of a bias-type first multiplication unit and a second transducer.

FIG. 12 illustrates a fourth example of a bias-type first multiplication unit 56 and a second transducer 54. The second transducer 54 according to the fourth example has approximately the same configuration as the switched-capacitor first transducer 50 illustrated in FIG. 8. Thus, the same components will be put with the same reference signs and the descriptions will be omitted.

The first multiplication unit 56 according to the fourth example includes a voltage generation unit 302. The voltage generation unit 302 has the same configuration as the configuration illustrated in FIG. 9.

Charge is accumulated in a fifth position detecting device 222 of the second transducer 54 according to the fourth example by the voltage generated by the voltage generation unit 302 via a switch instead of power source potential (VDD). In other words, a third switch 236 is connected between a fifth variable capacitance 232 and a voltage output end of the voltage generation unit 302. A fourth switch 238 is connected between a sixth variable capacitance 234 and the voltage output end of the voltage generation unit 302.

Such a first multiplication unit 56 according to the fourth example can vary the bias voltage to be applied to the fifth position detecting device 222 included in the second transducer 54 according to the first positional signal. As a result, the charge corresponding to the first positional signal is accumulated in the fifth variable capacitance 232 and the sixth variable capacitance 234 during the measurement period. In other words, the current corresponding to the first positional signal flows in the fifth variable capacitance 232 and the sixth variable capacitance 234 during the measurement period. Thus, the first multiplication unit 56 according to the fourth example can multiply the signal that the second transducer 54 detects from the second mechanical oscillator 44 by the first positional signal before the fifth amplification unit 224.

Figure 13:
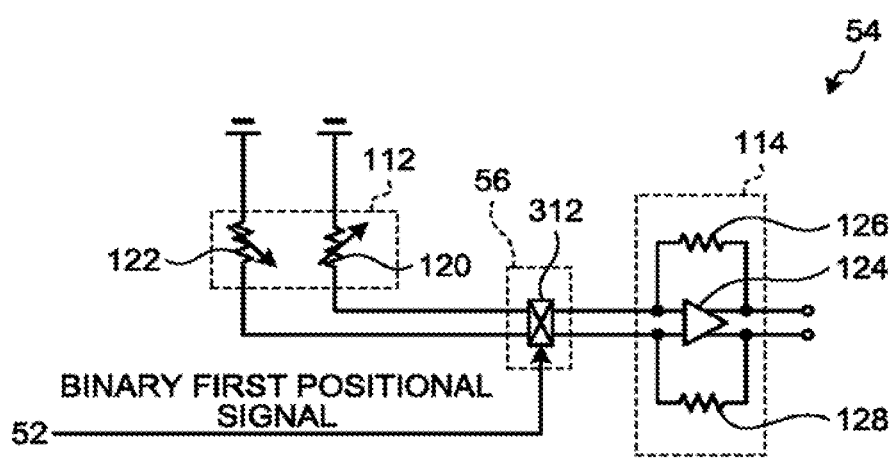
FIG. 13 is a view of a fifth example of a switch-type first multiplication unit and a second transducer.

FIG. 13 illustrates a fifth example of a switch-type first multiplication unit 56 and a second transducer 54. The second transducer 54 according to the fifth example has approximately the same configuration as the resistance first transducer 50 illustrated in FIG. 4. Thus, the same components will be put with the same reference signs and the descriptions will be omitted.

The first multiplication unit 56 according to the fifth example includes a switching unit 312. The switching unit 312 is a cross-point switch of two signal lines. In other words, the switching unit 312 is a switch that interchanges the signal circuits of the two signal lines.

The switching unit 312 according to the fifth example interchanges a signal line connected to a positive input terminal of as first differential amplifier 124 and a signal line connected to a negative input terminal of the first differential amplifier 124 according to a binary first positional signal. This enables the switching unit 312 to invert the positive part and negative part of the differential signal output from the first differential amplifier 124 according to the binary first positional signal. If the positive part and negative part of the differential signal output from the first differential amplifier 124 are inverted, the direction in which the signal varies is inverted.

As described above, the first multiplication unit 56 according to the fifth example can invert the direction in which the signal that the second transducer 54 detects from the second mechanical oscillator 44 varies according to the first positional signal. This enables the first multiplication unit 56 according to the fifth example to multiply the signal that the second transducer 54 detects from the second mechanical oscillator 44 by the first positional signal before the first amplification unit 114.

Figure 14:
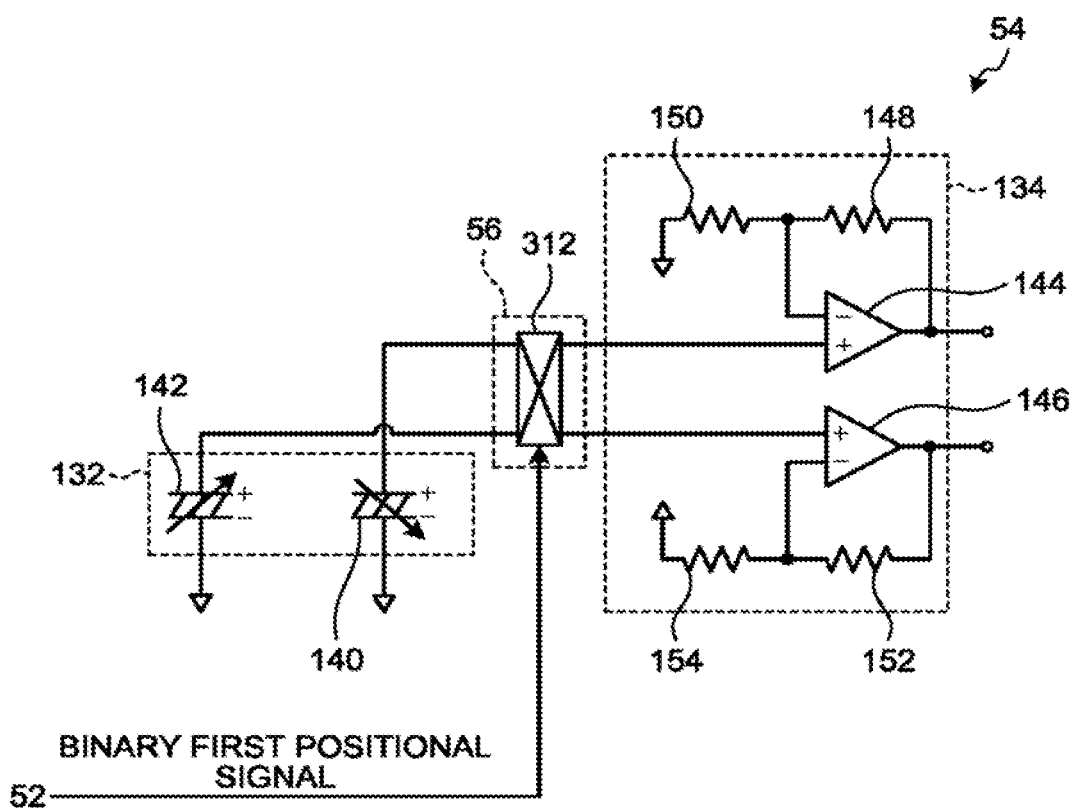
FIG. 14 is a view of a sixth example of a switch-type first multiplication unit and a second transducer.

FIG. 14 illustrates a sixth example of a switch-type first multiplication unit 56 and as second transducer 54. The second transducer 54 according to the sixth example has approximately the same configuration as the piezoelectric first transducer 50 illustrated in FIG. 5. Thus, the same components will be put with the same reference signs and the descriptions will be omitted.

The first multiplication unit 56 according to the sixth example includes a switching unit 312. The switching unit 312 has the same configuration as the configuration illustrated in FIG. 13.

The switching unit 312 according to the sixth example interchanges a signal line connected to a non-inverting input terminal of a first operational amplifier 144 and a signal line connected to a non-inverting input terminal of the second operational amplifier 146 according to a binary first positional signal. This enables the switching unit 312 to invert the positive part and negative part of the differential voltage between an output terminal of the first operational amplifier 144 and an output terminal of the second operational amplifier 146 according to the binary first positional signal.

As described above, the first multiplication unit 56 according to the sixth example can invert the direction in which the signal that the second transducer 54 detects from the second mechanical oscillator 44 varies according to the first positional signal. This enables the first multiplication unit 56 according to the sixth example to multiply the signal that the second transducer 54 detects from the second mechanical oscillator 44 by the first positional signal before the second amplification unit 134.

Figure 15:
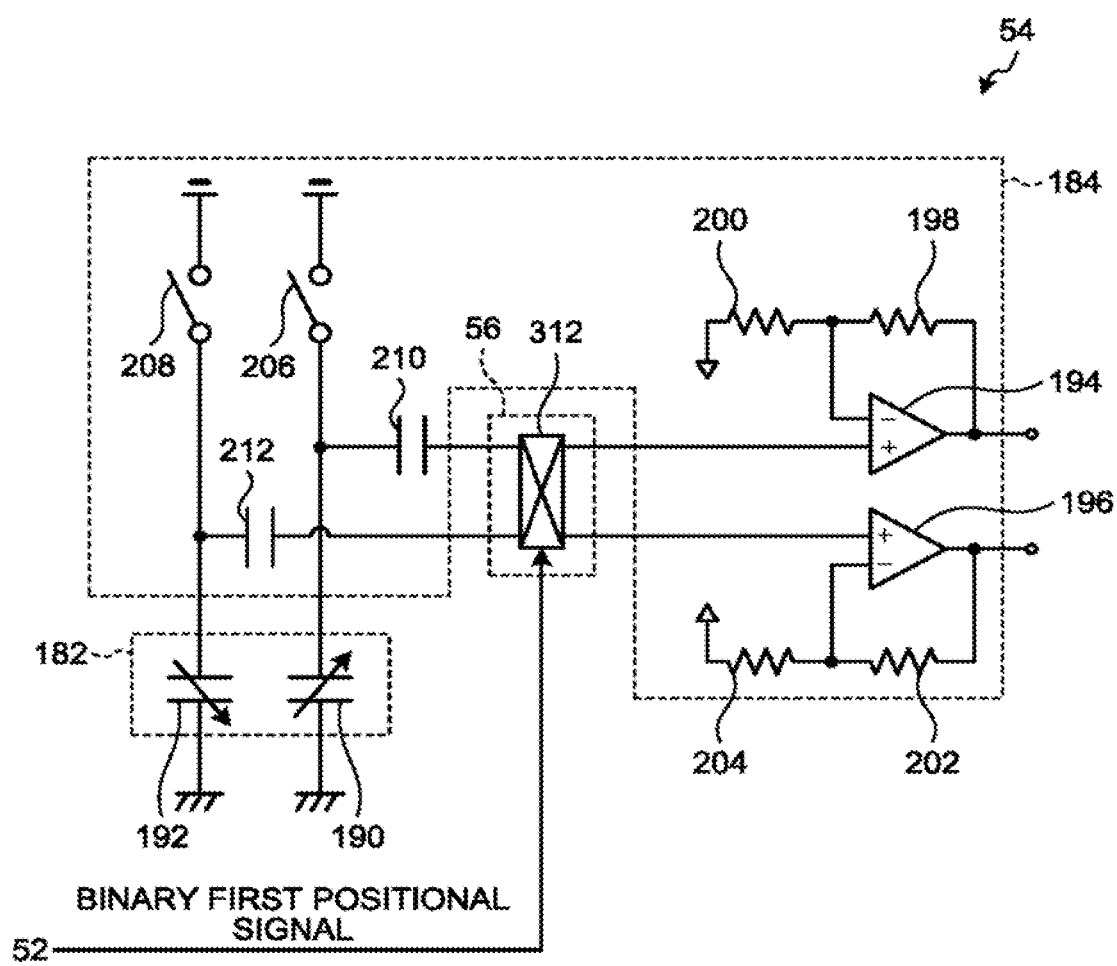
FIG. 15 is a view of a seventh example of a switch-type first multiplication unit and a second transducer.

FIG. 15 illustrates a seventh example of a switch-type first multiplication unit 56 and a second transducer 54. The second transducer 54 according to the seventh example has approximately the same configuration as the charge-fixed first transducer 50 illustrated in FIG. 7. Thus, the same components will be put with the same reference signs and the descriptions will be omitted.

The first multiplication unit 56 according to the seventh example includes a switching unit 312. The switching unit 312 has the same configuration as the configuration illustrated in FIG. 13.

The switching unit 312 according to the seventh example interchanges a signal line connected to as non-inverting input terminal of a third operational amplifier 194 and a signal line connected to a non-inverting input terminal of a fourth operational amplifier 196 according to a binary first positional signal. This enables the switching unit 312 to invert the positive part and negative part of the differential voltage between an output terminal of the third operational amplifier 194 and an output terminal of the fourth operational amplifier 196 according to the binary first positional signal.

As described above, the first multiplication unit 56 according to the seventh example can invert the direction in which the signal that the second transducer 54 detects from the second mechanical oscillator 44 varies according to the first positional signal. This enables the first multiplication unit 56 according to the seventh example to multiply the signal that the second transducer 54 detects from the second mechanical oscillator 44 by the first positional signal before the fourth amplification unit 184.

Figure 16:
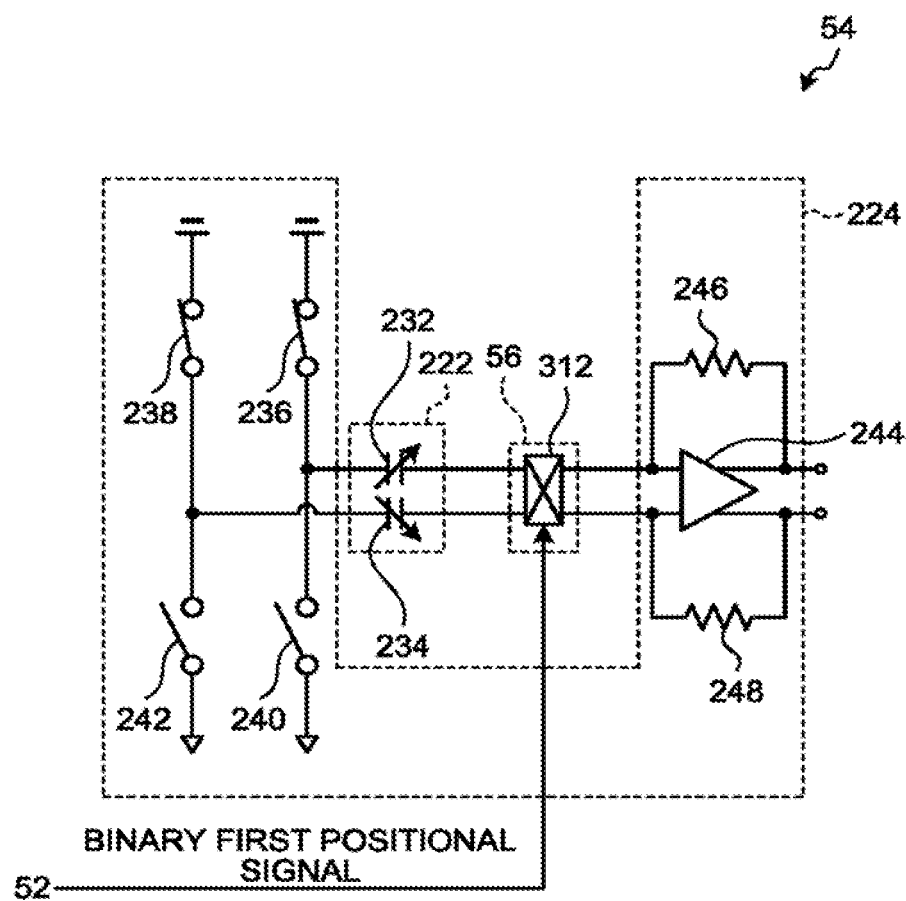
FIG. 16 is a view of an eighth example of a switch-type first multiplication unit and a second transducer.

FIG. 16 illustrates an eighth example of a switch-type first multiplication unit 56 and a second transducer 54. The second transducer 54 according to the eighth example has approximately the same configuration as the switched-capacitor first transducer 50 illustrated in FIG. 8. Thus, the same components will be put with the same reference signs and the descriptions will be omitted.

The first multiplication unit 56 according to the eighth example includes a switching unit 312. The switching unit 312 has the same configuration as the configuration illustrated in FIG. 13.

The switching unit 312 according to the eighth example interchanges a signal line connected to a positive input terminal of a third differential amplifier 244 and a signal line connected to a negative input terminal of the third differential amplifier 244 according to a binary first positional signal. This enables the switching unit 312 to invert the positive part and negative part of the differential signal output from the third differential amplifier 244 according to the binary first positional signal.

As described above, the first multiplication unit 56 according to the eighth example can invert the direction in which the signal that the second transducer 54 detects from the second mechanical oscillator 44 varies according to the first positional signal. This enables the first multiplication unit 56 according to the eighth example to multiply the signal that the second transducer 54 detects from the second mechanical oscillator 44 by the first positional signal before the fifth amplification unit 224.

Second Embodiment

Figure 17:
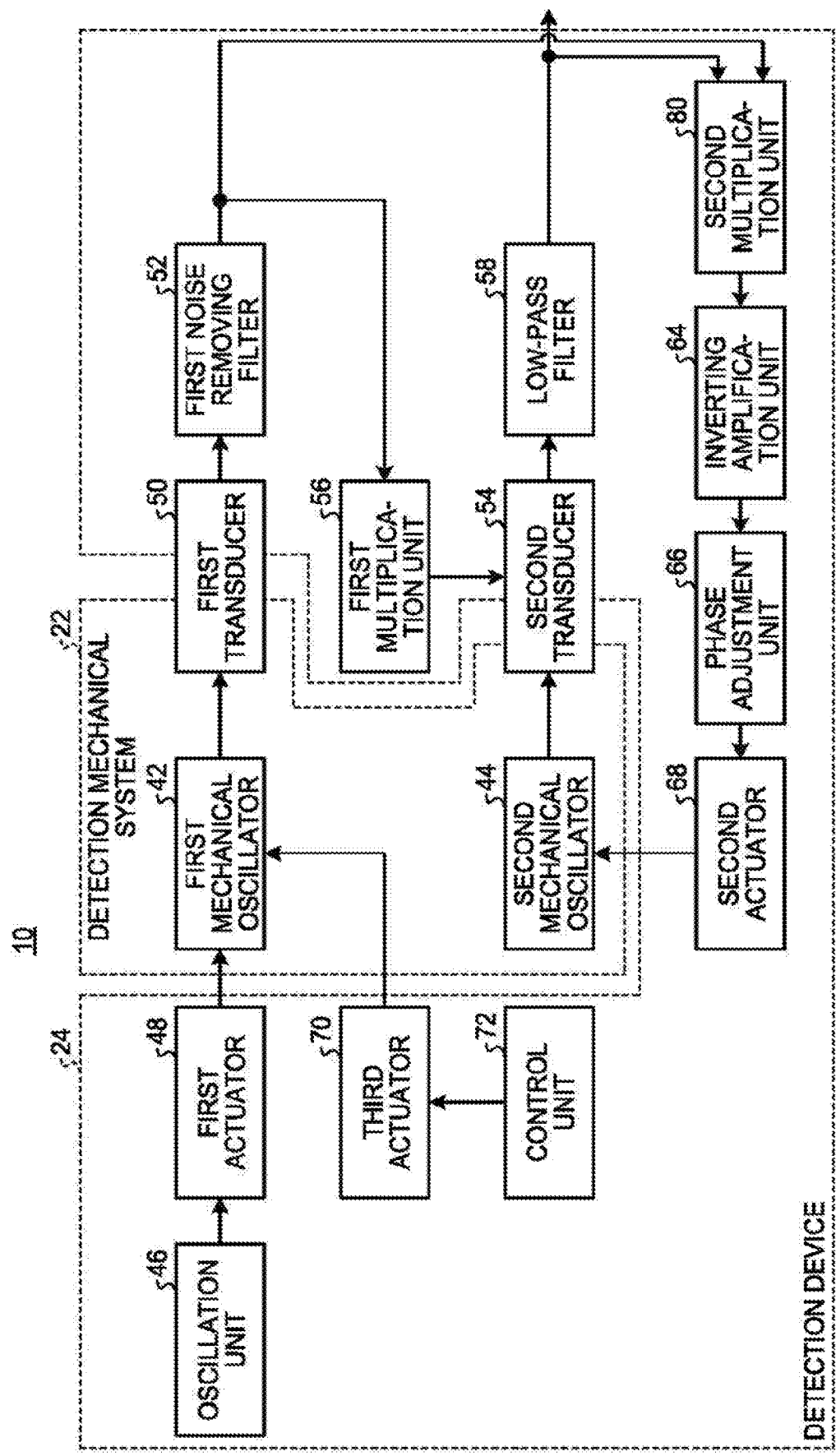
FIG. 17 is a view of a configuration of a sensor apparatus according to a second embodiment.

FIG. 17 illustrates a configuration of a sensor apparatus 10 according to a second embodiment. The sensor apparatus 10 according to the second embodiment includes approximately the same functions and configuration as the sensor apparatus 10 according to the first embodiment. In the description of the second embodiment, the blocks having approximately the same functions and configurations as the blocks described in the first embodiment will be put with the same reference signs and the descriptions will be omitted except for the descriptions of different points.

A detection device 24 according to the second embodiment includes an oscillation unit 46, a first actuator 48, a first transducer 50, a first noise removing filter 52, a second transducer 54, a first multiplication unit 56, a low-pass filter 58, a second multiplication unit 80, an inverting amplification unit 64, a phase adjustment unit 66, a second actuator 68, a third actuator 70, and a control unit 72. In other words, the detection device 24 further includes the second multiplication unit 80 but does not include the third transducer 60 and the second noise removing filter 62 in comparison with the first embodiment.

The second multiplication unit 80 obtains a first positional signal output from the first noise removing filter 52. The second multiplication unit 80 further obtains an output signal output from the low-pass filter 58. Then, the second multiplication unit 80 generates a modulated signal by multiplying the first positional signal by the output signal.

The second multiplication unit 80 may generate the modulated signal by multiplying the signal with an analog circuit such as an operational amplifier. Alternatively, the second multiplication unit 80 may generate the modulated signal by obtaining a binary first positional signal and switching the positive part and negative part of the output signal according to the binary first positional signal.

The inverting amplification unit 64 obtains the modulated signal from the second multiplication unit 80. The inverting amplification unit 64 generates a control signal by inverting and amplifying the modulated signal.

The detection device 24 according to the second embodiment can detect the position to which the second mechanical oscillator 44 is moved, and control the position to which the second mechanical oscillator 44 is moved using negative feedback. This enables the second mechanical oscillator 44 to stably operate even when the disturbance in step response is exerted. Thus, the detection device 24 can output an output signal from which the disturbance in step response is removed.

Figure 18:
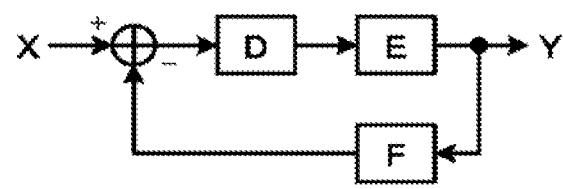
FIG. 18 is a block diagram of a transfer characteristic of the sensor apparatus according to the second embodiment.

FIG. 18 is a block diagram of a transfer characteristic of the sensor apparatus 10 according to the second embodiment in order to remove step response.

FIG. 18 illustrates an exemplary transfer characteristic of a feedback system constituted by the second mechanical oscillator 44, the second transducer 54, the low-pass filter 58, the second multiplication unit 80, the inverting amplification unit 64, the phase adjustment unit 66, and the second actuator 68. The X indicates a disturbance exerted on the second mechanical oscillator 44. The Y indicates an output from the low-pass filter 58. The D indicates a resonance transfer function of a mechanical system of the second mechanical oscillator 44. The E indicates a transfer function of the second transducer 54, and the E is a constant. The F indicates a transfer function of a feedback system from the second multiplication unit 80 to the second actuator 68, and the F is a constant.

To simplify the transfer characteristic, the resonance transfer function of the second mechanical oscillator 44 takes Q as a gain (Q value) at a resonance frequency, and takes one as the gain at a frequency lower than the resonance frequency. In such a case, the transfer function in FIG. 18 is Y/X=DE/(1+DEF).

It is assumed that the EF is 1/100. In this case, the DEF is smaller enough than one. Thus, the transfer function is Y/X=(DE/(1+DEF))≈DE at a frequency lower than the resonance frequency. In contrast, D=Q holds and the D is larger enough than one at the resonance frequency. Thus, the transfer function is Y/X=(DE/(1+DEF))≈1/EF.

As described above, the transfer function shows that the gain decreases at the resonance frequency. In contrast, the transfer function shows that the gain does not decrease at frequencies except for the resonance frequency.

Accordingly, the detection device 24 can decrease an attenuation time constant by reducing the effective Q value of the second mechanical oscillator 44 by 1/EFQ. The frequency of the Coriolis force that acts in the detection mechanical system 22 is set at a frequency lower enough than the resonance frequency of the second mechanical oscillator 44. Thus, the detection device 24 can transfer the desired signal except for a signal at the resonance frequency without attenuating the desired signal.

Figure 19:
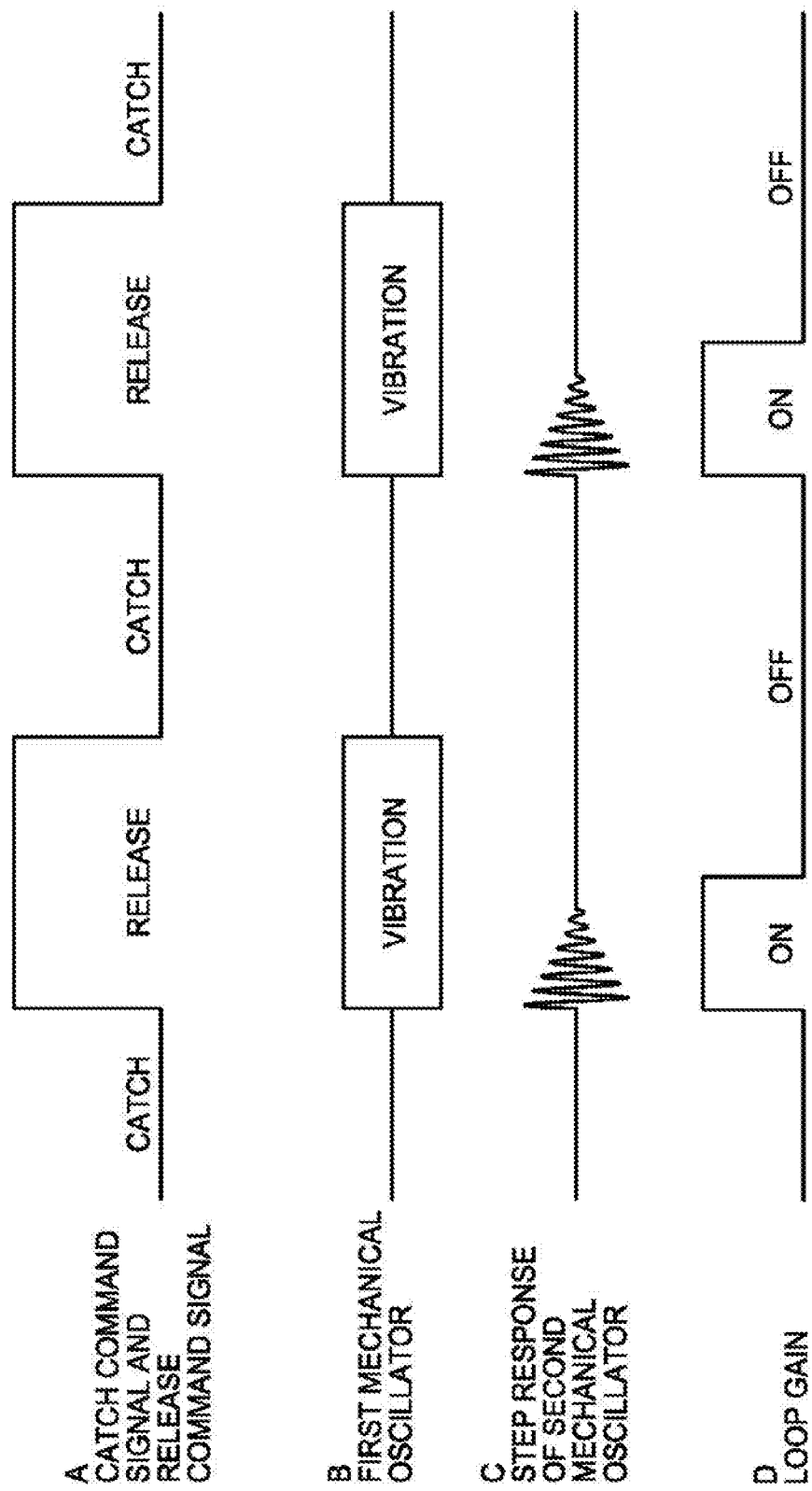
FIG. 19 is a waveform chart, for example, of the timing for switching loop gain.

FIG. 19 is a waveform chart of a CR signal, the vibration of the first mechanical oscillator 42, the disturbance exerted on the second mechanical oscillator 44, and the timing at which loop gain is switched. The control unit 72 may switch, for example, the gain of the inverting amplification unit 64. For example, the control unit 72 may be able to turn the loop gain of the feedback loop on and off.

For example, as illustrated in D of FIG. 19, the control unit 72 turns on the loop gain of the feedback loop at the timing when a measurement starts in order to start controlling the position to which the second actuator 68 moves the second mechanical oscillator 44. Then, for example, the control unit 72 turns off the loop gain of the feedback loop after a predetermined period of time has passed since the start of the measurement in order to stop controlling the position to which the second actuator 68 moves the second mechanical oscillator 44.

A disturbance (a disturbance in step response), which is exerted on the second mechanical oscillator 44 when the first mechanical oscillator 42 intermittently operates, starts when the first mechanical oscillator 42 starts vibrating and then attenuates. Thus, the disturbance in step response decreases enough after a certain period of time has passed since the start of the vibration of the first mechanical oscillator 42. The control unit 72 stops controlling the position to which the second actuator 68 moves the second mechanical oscillator 44 after a predetermined period of time has passed since the start of measurement. This enables the control unit 72 to reduce the electricity consumption by disabling the feedback loop after the disturbance in step response decreases.

Note that the control unit 72 having the configuration described in the first embodiment may also perform such a control. Thus, in the configuration described in the first embodiment, the control unit 72 can also reduce the electricity consumption by disabling the feedback loop after the disturbance in step response decreases.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A detection device that detects a dynamic quantity exerted on a detection mechanical system, the detection mechanical system including a first mechanical oscillator and a second mechanical oscillator, the first mechanical oscillator being a mechanical system held by a predetermined amount of spring force and capable of reciprocating in a first direction, the second mechanical oscillator being a mechanical system formed on a substrate on which the first mechanical oscillator is formed, held by a predetermined amount of spring force and capable of reciprocating in a second direction perpendicular to the first direction, the detection device comprising:
a first transducer including
a first element configured to detect a first position to which a first actuator makes the first mechanical oscillator reciprocate in the first direction and output a first differential signal indicating the first position, and
a first amplifier configured to output a first positional signal that is generated by differential-amplifying the first differential signal;
a second transducer including
a second element configured to detect a second position to which a second actuator makes the second mechanical oscillator reciprocate in the second direction and output a second differential signal indicating the second position,
a switching circuit configured to invert a positive part and a negative part of the second differential signal according to the first positional signal that is binary, and
a second amplifier configured to output a second positional signal that is generated by differential-amplifying the second differential signal output from the switching circuit;
a low-pass filter configured to remove a harmonic component from the second positional signal to output an output signal indicating a detection result;
a third transducer including a third element configured to detect a third position of the second mechanical oscillator in the second direction and output a third differential signal indicating the third position, and a third amplifier configured to output a third positional signal that is generated by differential-amplifying the third differential signal;

an inverting amplifier configured to generate a first control signal by inverting the third positional signal, and give the generated first control signal to the second actuator that moves the second mechanical oscillator in the second direction; and a control circuit configured to give a third actuator a second control signal that repeats a catch command to stop the first mechanical oscillator from reciprocating in the first direction and a release command to start the first mechanical oscillator reciprocating.

2. The device according to claim 1, further comprising:
a phase adjustment circuit configured to adjust a phase of the control signal by an amount of phase corresponding to a response lag of the second mechanical oscillator.

3. The device according to claim 1,
wherein the control circuit stops controlling a position to which the second actuator moves the second mechanical oscillator after a predetermined period of time has passed since a measurement starts.

4. A sensor apparatus comprising:
a detection mechanical system including a first mechanical oscillator and a second mechanical oscillator; and
a detection device configured to detect a dynamic quantity exerted on the detection mechanical system, wherein
the first mechanical oscillator is a mechanical system held by a predetermined amount of spring force and capable of reciprocating in a first direction, and
the second mechanical oscillator is a mechanical system formed on a substrate on which the first mechanical oscillator is formed, held by a predetermined amount of spring force and capable of reciprocating in a second direction perpendicular to the first direction, and
the detection device comprises:
a first transducer including
a first element configured to detect a first position to which a first actuator makes the first mechanical oscillator reciprocate in the first direction and output a first differential signal indicating the first position, and a first amplifier configured to output a first positional signal that is generated by differential-amplifying the first differential signal;

a second transducer including
a second element configured to detect a second position to which a second actuator makes the second mechanical oscillator reciprocate in the second direction and output a second differential signal indicating the second position, a switching circuit configured to invert a positive part and a negative part of the second differential signal according to the first positional signal that is binary, and a second amplifier configured to output a second positional signal that is generated by differential-amplifying the second differential signal output from the switching circuit;

a low-pass filter configured to remove a harmonic component from the second positional signal to output an output signal indicating a detection result;

a third transducer including
a third element configured to detect a third position of the second mechanical oscillator in the second direction and output a third differential signal indicating the third position, and a third amplifier configured to output a third positional signal that is generated by differential-amplifying the third differential signal;

an inverting amplifier configured to generate a first control signal by inverting the third positional signal, and give the generated first control signal to the second actuator that moves the second mechanical oscillator in the second direction; and a control circuit configured to give a third actuator a second control signal that repeats a catch command to stop the first mechanical oscillator from reciprocating in the first direction and a release command to start the first mechanical oscillator reciprocating, wherein the first mechanical oscillator, the second mechanical oscillator, the first element, the second element, and the third element are formed on a semiconductor substrate with a Micro Electro Mechanical Systems (MEMS) technology.

* * * * *